(12) United States Patent
Lo

(10) Patent No.: US 10,282,110 B2
(45) Date of Patent: May 7, 2019

(54) LAST WRITTEN PAGE INDICATOR

(71) Applicant: SK Hynix Inc., Gyeonggi-do (KR)

(72) Inventor: Yungcheng Thomas Lo, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 15/421,113

(22) Filed: Jan. 31, 2017

(65) Prior Publication Data
US 2017/0293437 A1   Oct. 12, 2017

Related U.S. Application Data

(60) Provisional application No. 62/320,406, filed on Apr. 8, 2016.

(51) Int. Cl.
| | |
|---|---|
| *G06F 3/06* | (2006.01) |
| *G11C 16/08* | (2006.01) |
| *G11C 16/04* | (2006.01) |
| *G11C 16/16* | (2006.01) |

(52) U.S. Cl.
CPC .......... *G06F 3/0613* (2013.01); *G06F 3/064* (2013.01); *G06F 3/0659* (2013.01); *G06F 3/0661* (2013.01); *G06F 3/0679* (2013.01); *G11C 16/0483* (2013.01); *G11C 16/08* (2013.01); *G11C 16/16* (2013.01)

(58) Field of Classification Search
CPC ...... G06F 3/064; G06F 3/0659; G06F 3/0661; G06F 3/0679; G11C 16/08
See application file for complete search history.

(56) References Cited

U.S. PATENT DOCUMENTS

| | | | |
|---|---|---|---|
| 6,988,175 B2 | 1/2006 | Lasser | |
| 7,818,492 B2 | 10/2010 | Luo et al. | |
| 2010/0106897 A1 | 4/2010 | Yoshimura | |
| 2013/0343131 A1 | 12/2013 | Wu et al. | |
| 2014/0043897 A1* | 2/2014 | Pan | G11C 11/5642 365/185.03 |
| 2016/0118143 A1* | 4/2016 | Muchherla | G11C 29/50004 714/721 |
| 2016/0378598 A1* | 12/2016 | Chen | G06F 11/1012 714/764 |

* cited by examiner

*Primary Examiner* — Eric Cardwell
(74) *Attorney, Agent, or Firm* — Kilpatrick Townsend & Stockton LLP

(57) ABSTRACT

A flash memory device includes a flash memory having a plurality of blocks, each block having a plurality of pages, and a control circuit configured to receive a command, decode the received command to determine whether the command is a last written page command, upon determining that the command is the last written page command, select a block of the plurality of blocks, and perform a number of iterations. Each of the iterations includes obtain a measurement of a signal level of a page in the selected block, compare the signal level with a predetermined threshold value, determine whether the page is an erased page based on a comparison result, upon determining that the page is an erased page, save an address associated with the erased page and output the address of the erased page, and upon determining that the page is not an erase page, perform a next iteration.

22 Claims, 7 Drawing Sheets

LAST WRITTEN PAGE INDICATOR

CROSS-REFERENCES TO RELATED APPLICATIONS

This application claims the benefit of priority under 35 U.S.C. § 119(e) to U.S. Provisional Application No. 62/320,406, filed Apr. 8, 2016, which is hereby incorporated by reference in its entirety and for all purposes.

This application is related to commonly-assigned, U.S. patent application Ser. No. 15/421,112, entitled "ERASE PAGE INDICATOR," filed Jan. 31, 2017, which is hereby incorporated by reference in its entirety.

TECHNICAL FIELD

The present invention relates generally to flash memories, and more particularly to efficiently reducing the communication bandwidth between a controller and a flash memory.

BACKGROUND

At power-up, a system having a flash memory has to determine a last written page address of the flash memory. In general, the system communicates with the flash memory through a controller. Currently, an erased page of a NAND flash memory is determined by the controller. A NAND flash memory sends data associated with a request page address to the controller, which determines whether or not the requested page is an erased page by counting the number of 1's or number of 0xFF patterns of the page. The data transfer of a selected page across the channel between the controller and the NAND flash memory is time consuming and adds additional time to the start-up process of the system.

In conventional operating systems, a host or a controller external to the flash memory is used to determine whether a page has been written to or whether it is available for new data. For example, software in the controller or host will read from the flash memory, determine an available page (i.e., an erased page) and store the available page as a target page in a temporary memory (or register). However, information in the temporary memory associated with the stored target page is lost when the controller (host) is powered down. At power up, the controller will have to determine the address of the last written page of the flash memory again. The determination of an available page is performed sequentially page per page until an available page is found. If not, then the controller has to read pages of the next block and continues the search process until an available page is found.

Other techniques may use binary search to locate an available page in a block. However, the binary-search approaches are time-intensive and consume channel bandwidth and power, resulting in overall poor performance of the system.

Thus, it is desirable to have a flash memory device and method that can determine the last written page without having the controller or host to perform time- and bandwidth-intensive processing.

BRIEF SUMMARY OF THE INVENTION

Various techniques have been developed to determine the last written page of a flash memory. For example, one method includes sending a read command to the flash memory to read the entire page and counts the number of 1's of the page to determine the page status. Other methods may involve reading a particular block and perform a binary search algorithm page-by-page to determine the last written page. These methods have the shortcomings of wasting valuable bandwidth between the controller and the flash memory and slowing down the power-up process of the system.

The current Last Written Page (LWP) search mechanism is to search the last page in the block in a flash memory. Instead of transferring a whole page of data on the requested page address sequentially and counting the number of 1's, a last written page indicator can be used to improve current counting mechanisms in the controller. In accordance with the present invention, simple operations can be implemented in a flash memory device to determine the address of the last written page in a block and send the last written page address back to the controller instead sequentially transmitting each page of the flash memory device to the controller, thereby significantly improving the system performance.

According to some embodiments of the present invention, a flash memory device may include a flash memory containing a plurality of blocks, each block comprising a plurality of pages, and a control circuit configured to receive a command, decode the received command to determine whether the command is a last written page command, upon determining that the command is the last written page command, select a block of the plurality of blocks, perform a number of iterations. Each of the iterations includes obtain a measurement of a signal level of a page in the selected block, compare the signal level with a first predetermined threshold value, determine whether the page is an erased page based on a first comparison result, upon determining that the page is an erased page, save an address associated with the erased page and output the address of the erased page, and upon determining that the page is not an erase page, perform a next iteration.

In one embodiment, the selected block is a block having at least an erased page.

In one embodiment, the control circuit is configured to obtain a signal level of the selected block, compare the signal level of the selected block with a second predetermined threshold value, determine whether the selected block contains at least an erased page based on a second comparison result, upon determining that the selected block does not contain at least an erased page, select a next block in the plurality of block and repeat until a block is found to contain at least an erased page.

In one embodiment, the signal level of the selected block is a measurement of voltage or current changes on a plurality of bit lines associated with the selected block.

In one embodiment, the second predetermined threshold value is an average voltage value of a sum of voltages of blocks having at least an erased page and a margin.

In one embodiment, the flash memory device may further include a last written page register configured to stored the address associated with the erased page, and an interface circuit coupled to the last written page register and configured to communicate the stored address to a controller.

In one embodiment, the flash memory device may further include a page address counter configured to generate a page address to select a next page until an erased page in the selected block is found.

In one embodiment, the flash memory device may further include an accumulator configured to obtain the measurement of the signal level of the page in the selected block by summing signals on bit lines associated with the page, and a comparator configured to compare the signal level with the first predetermined threshold value threshold voltage.

In one embodiment, the accumulator is an analog summing circuit including a first operation amplifier and the comparator is an analog comparator including a second operation amplifier.

In one embodiment, the accumulator is an analog summing circuit including an operation amplifier and the comparator comprising an analog-to-digital converter.

In one embodiment, the flash memory comprises a NAND flash.

Embodiments of the present invention also provide a method of determining a last written page of a flash memory device having a plurality of blocks. The method may include receiving a command, decoding the received command to determine whether the command is a command requesting a last written page address, selecting a block of the plurality of blocks upon determining that the command is the last written page command, performing a number of iterations.

In one embodiment, each iteration may include obtaining a measurement of a first signal level associated with a page of the block, comparing the first signal level with a first predetermined threshold value to obtain a first comparison result, determining a state of the page of the block based on the first comparison result, and performing a next iteration until a page of the block is found to be an erased page, storing an address of the erased page in a register, and outputting the address to an external device.

In one embodiment, selecting the block of the plurality of blocks includes obtaining a measurement of a second signal level associated with the block, comparing the second signal level with a second predetermined threshold value to obtain a second comparison result, determining whether the block contains at least an erased page based on the second comparison result, upon determining that the block does not contains at least an erased page, selecting a next block of the plurality of blocks, repeating the obtaining, comparing, and determining steps until a subsequent block of the plurality of blocks is found to contain at least an erased page.

In one embodiment, the second signal level is associated with voltage or current changes on a plurality of bit lines associated with the selected block.

In one embodiment, the second predetermined threshold value is an average voltage value of a sum of voltages of blocks having at least an erased page and a margin.

In one embodiment, obtaining the measurement of the first signal level includes accumulating signal changes on a plurality of bit lines associated with the page of the block.

In one embodiment, the first predetermined threshold value is an absolute maximum value of a page having all of bits written to "0's" or "1's."

Embodiments of the present invention also provide a flash memory device. The flash memory may include a flash memory comprising a plurality of blocks, each block comprising a plurality of pages, each page comprising a plurality of bit lines, a decoder configured to determine whether a received command is a last written page command, an accumulator coupled to the plurality of bit lines and configured to accumulate signal changes on the plurality of bit lines to obtain a signal level, a comparator configured to compare the signal level with a predetermined threshold value to obtain a comparison result, a control circuit configured to control whether the accumulator and the comparator are operative based on a decode result of the decoder.

In one embodiment, the flash memory device may further include a block counter configured to select a block of the plurality of blocks, a page counter configured to select a page of the selected block, a register configured to store an address associated with an erased page. The control circuit is operative to determine an address of the selected block based on a content of the block counter and an address of the selected page based on a content of the page counter and save the determined address of the selected block and the determined address of the selected page into the register.

In one embodiment, the accumulator is an analog summing circuit including a first operation amplifier, and the comparator is an analog comparator including a second operation amplifier.

In one embodiment, the predetermined threshold value is a digital value, the accumulator is an analog summing circuit including a first operation amplifier for outputting the signal level, and the comparator comprises an analog-to-digital converter configured to convert the signal level to a digital representation and compare the digital representation with the digital value.

In one embodiment, the predetermined threshold value is a digital value, the accumulator is a digital counter coupled to a data register and configured to count a total number of "0's" or "1's" stored in the data register, and the comparator is a digital circuit configured to compare the total number of "0's" or "1's" with the digital value.

The following description, together with the accompanying drawings, will provide a better understanding of the nature and advantages of the claimed invention.

DETAILED DESCRIPTION OF THE INVENTION

Figure 1:
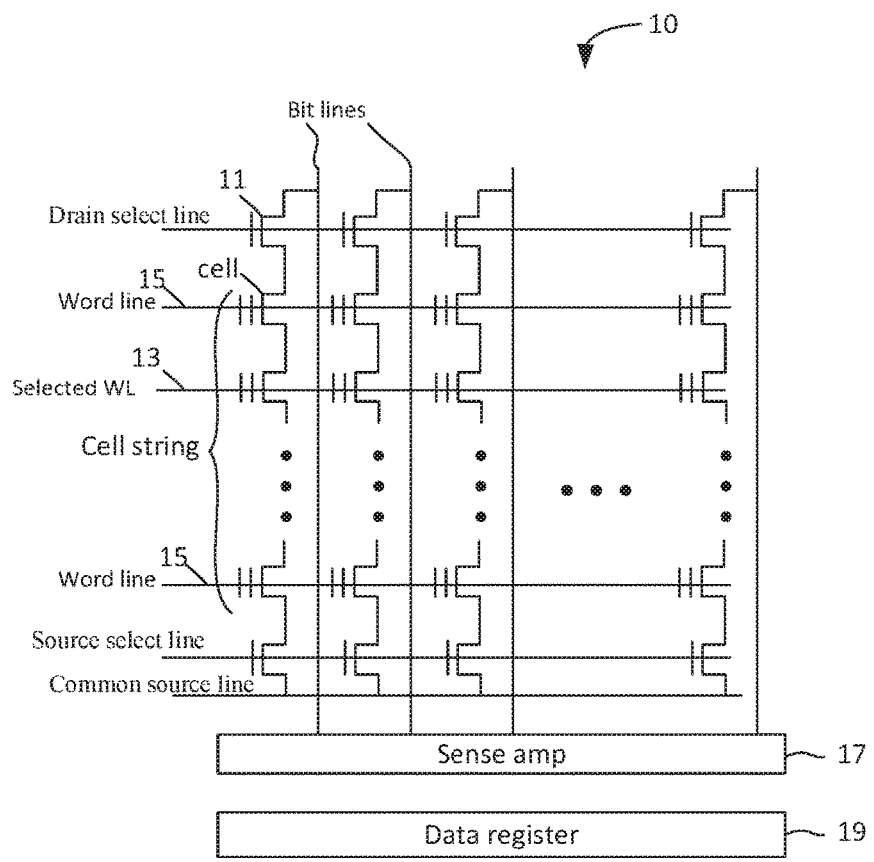
FIG. 1 is a schematic diagram of a portion of a NAND flash memory that can be used with embodiments of the present disclosure.

In the following description, numerous specific details are provided for a thorough understanding of the present disclosure. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the disclosure are described herein with reference to functional block diagrams that are schematic illustrations of idealized embodiments (and intermediate structures) of the disclosure.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

As used herein, the terms "device," "apparatus,", "system," etc. are intended to be interchangeable with one another. The term "module" may refer to hardware, software, firmware, and may include an Application Specific Integrated Circuit (ASIC), an electronic circuit, logic, instructions executable by a processor, etc.

Currently, many operations of a NAND flash memory, e.g., counting, calculating, error detecting, error correcting, etc., are performed by the controller. However, transferring data through the channel between the controller and the NAND flash memory is bandwidth expensive. Thus, it is useful to reserve the channel for important high-bandwidth operations and have the NAND flash memory perform other simple operations such as counting. Accordingly, according to the present invention, a flash memory can internally perform simple operations such as to search the last written page from a block and return the last written page address to the controller to eliminate the data transfer time between the controller and the flash memory.

Memory cells in a NAND flash memory may be programmed to a desired state. A single cell (SLC) can represent two states (e.g., 1 bit for 0 and 1). Flash memory cells can also store more than two states (e.g., 2 bits for 4 states, 3 bits for 8 states, etc.). Such cells are referred to as multi-state memory cells (MLCs). MLCs may allow the manufacture of higher density memories without increasing the number of memory cells since each cell can represent more than one bit.

A page of memory cells may have an erased (unwritten) state and a programmed (written) state. An entire block must be erased in an MLC flash memory before a page of the block can have new data written into it.

Embodiments of the present disclosure provide a flash memory device and method of replacing current mechanisms of transferring a whole page data to a controller with sending an erased page indicator to minimize the usage of the channel. The channel bandwidth can be utilized more efficiently.

FIG. 1 is a schematic diagram illustrating a portion 10 of a flash memory that can be used in various embodiments of the present disclosure. Referring to FIG. 1, portion 10 includes a plurality of memory-cell strings, each string is connected to a bit line and includes a plurality of series-connected memory cells. Each memory cell has an n-channel MOSFET structure including a floating gate as a charge accumulation layer and a control gate. Adjacent memory cells share the drain or source. The control gates of memory cells of the same row are connected to a word line A group of memory cell strings which share a group of word lines forms a block. In an erase operation, all memory cells in a block are erased. In read and write operations, a select transistor (e.g., drain select transistor 11) is turned on to connect a series-connected memory-cell string to a bit line. A selection voltage is applied to a selected word line 13, and a non-selection voltage is applied to remaining word lines 15 on the same memory-cell string. A sense amplifier 17 is connected to each bit line of a page (memory cells having the control gate connected to the selected word line) that shares the selected word line. Data register 19 has the size of the selected page to store data of the selected page.

Figure 2:
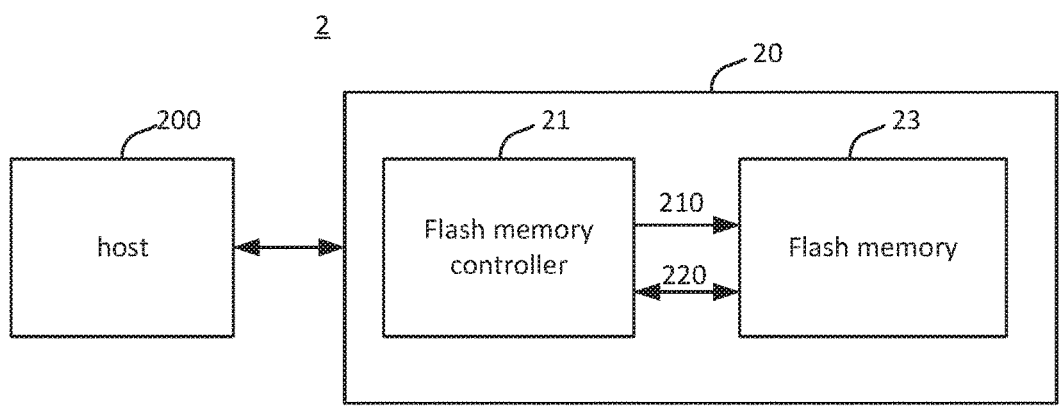
FIG. 2 is a simplified block diagram illustrating a system including a host coupled to a flash memory device according to some embodiments of the present disclosure.

FIG. 2 is a simplified block diagram illustrating a system 2 including a host 200 coupled to a flash memory device 20. Flash memory device 20 may include a flash memory controller 21 communicating with a flash memory 23. In some embodiments, flash memory 23 can be any non-volatile memory, e.g., a NAND flash. In some embodiments, flash memory 23 may be made up of NAND flash cells, e.g, an SLC NAND cell, or an MLC NAND cell. A row of NAND cells can make up a word line (WL). A page generally shares the same word line and can comprise thousands of NAND cells. A block can include a two-dimensional array comprising pages (rows) ans strings (columns). FIG. 1 shows an example of a portion of a flash memory.

Flash memory controller 21 can read or write data to flash memory 23 one page at the time. Flash memory controller 21 can access data stored in flash memory 23 through an I/O connection 220. When the I/O connection is 8 bits wide (1 byte), then the controller reads out data in register 19 sequentially byte by byte. For example, if the page contains 512 bytes, at least 512 clocks are necessary to read out the register. In order to write data to a page of the flash memory, data of the page must be read out sequentially byte by byte by the flash memory controller, the flash memory controller then determines whether the page has been erased before perform a new write to that page. That means, if the page contains 512 bytes, then at least 512 clocks are required in order to determine whether or not the page is an erased page. This way of determining whether or not a page is an erased page is time intensive and consumes channel bandwidth and power as data passes through the I/O connection.

Host 200 can include any appropriate hardware device, software application, or a combination of hardware and software. In some embodiments, host 200 can include a host-side controller (not shown). In some embodiments, flash memory controller 21 can interface between host 200 and flash memory 23. Flash memory controller 21 can be configured to receive various commands from host 200 and interface with flash memory 23 based on these commands. Flash memory controller 21 can enable flash memory 23 to perform various operations based on controls signals received from host 200.

Figure 3:
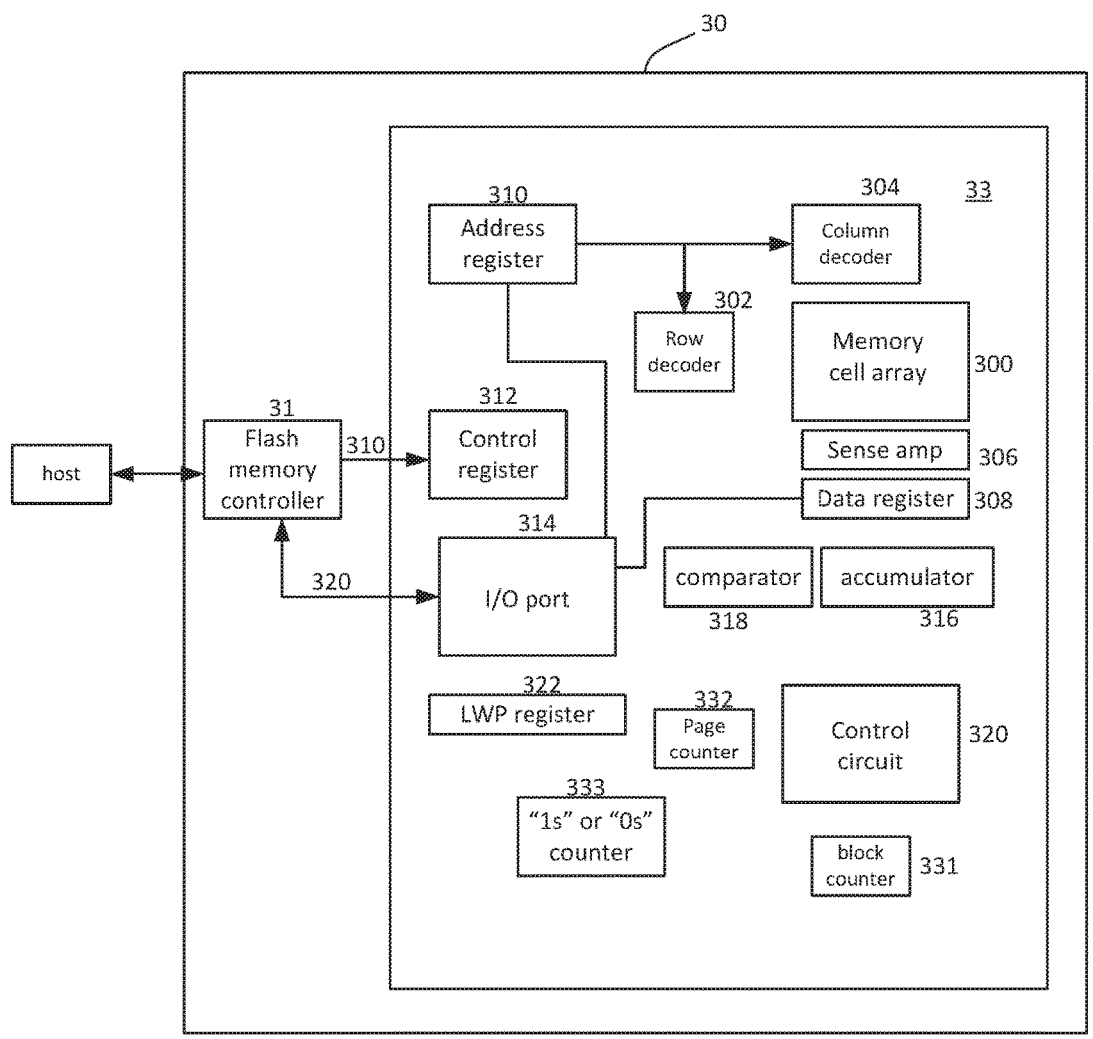
FIG. 3 is a block diagram of the flash memory device including a control circuit and a last written page register according to exemplary embodiments of the present disclosure.

FIG. 3 is a functional block diagram of a flash memory device 30 according to embodiments of the present invention. Flash memory device 30 may include a flash controller 31 coupled to a flash memory 33. Flash memory 33 may include a row decoder 302, a column decoder 304, a sense amplifier 306, a data register 308, and an address register 310. Flash memory 33 also includes a control register 312 and an I/O port 314. Control register 312 is coupled to flash memory controller 31 that is external to flash memory 33. Control register 312 is configured to receive commands (e.g., CE, CLE, ALE, WE, RE, WP, etc.) from flash memory controller 31 via a connection 310. For example, command CE (chip enable) selects flash memory 30; command CLE (chip latch enable) is to control loading of a command from the external device to the flash memory; command ALE (address latch enable) is to latch the address to the address register; command WE (write enable) is to acquire data from the I/O port; RE (read enable) is to read data out from the register; WP (write program) is to write data to the memory cell array. The I/O port is configured to transfer address, data to and from the external controller through a bidirectional connection 220.

Flash memory 33 further includes an accumulator 316, a comparator 318, a control circuit 320, and a last written page (LPW) register 122. Accumulator 316 may be coupled to a selected page of the memory cell array and configured to obtain an accumulated voltage level or current level of data associated with the selected page under control signals issued by the control circuit. Comparator 318 is coupled to the accumulator and configured to determine whether the voltage is above, below or within a predetermined value range. Control circuit 320 is the central processing unit configured to control the entire flash memory device 30 during various operating modes. Control circuit 320 may include a block counter 331 for addressing blocks in the memory array and a page counter 332 for addressing pages in a block. The function of the accumulator, comparator, control circuit including the block counter and page counter and LPW register will be described further in detail below.

Figure 4:
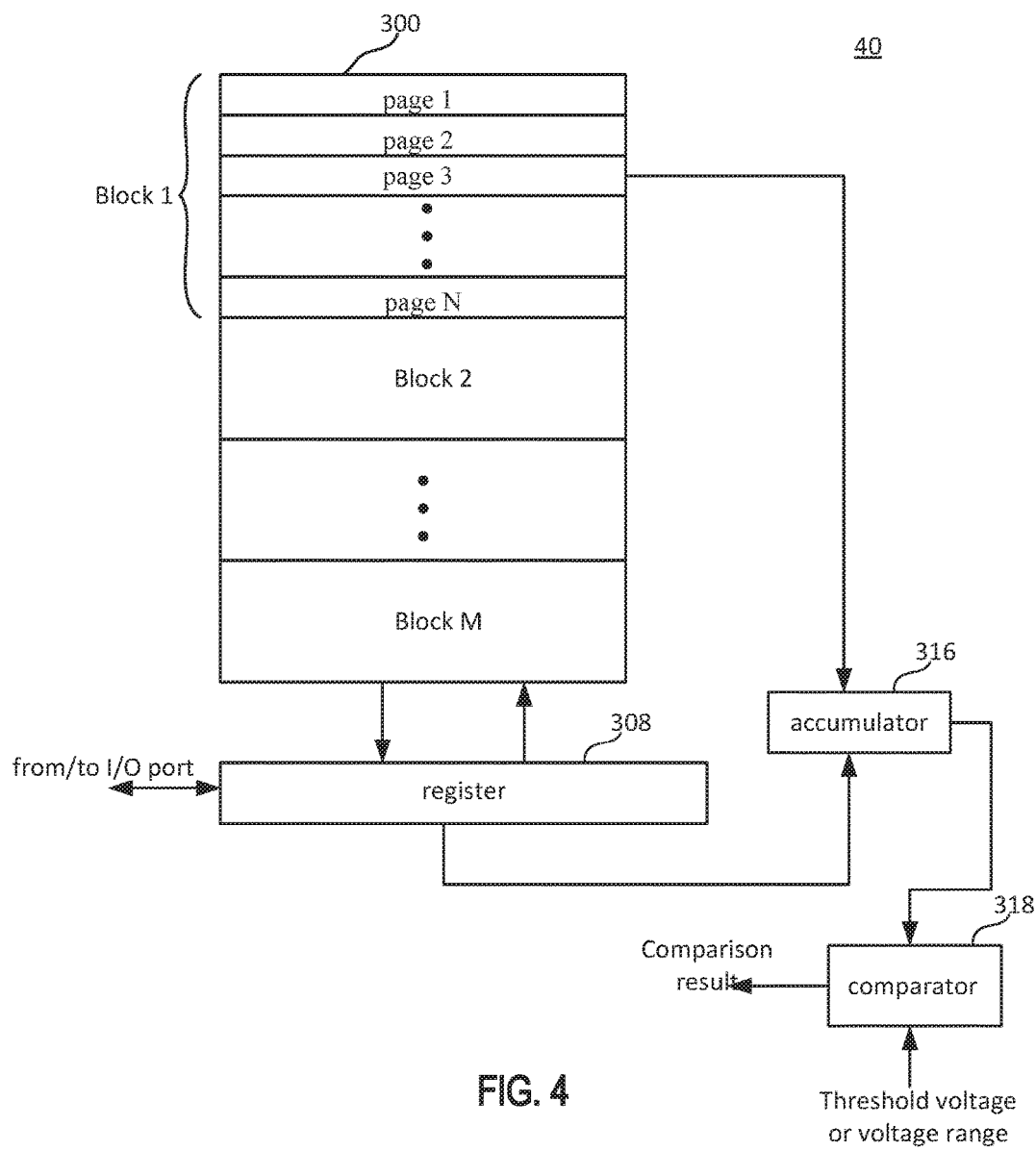
FIG. 4 is a block diagram of a portion of the flash memory device according to some exemplary embodiments of the present disclosure.

FIG. 4 is a schematic block diagram illustrating a flash memory configuration 40 according to an embodiment of the present disclosure. As shown in FIG. 4, the flash memory includes a NAND flash 300 comprising a number M of blocks (block 1, block 2, . . . , block M), and each block contains a number N of pages (page 1, page 2, . . . , page N). A page may contain a multiple of 512 bytes, e.g., 512 bytes, 1,024 (1K) bytes, 2048 (2K) bytes, 16 K, 32 K, etc. During a read operation, data of a selected page is sensed by the sense amplifier and latched into data register 308. The size of data register 308 matches the page size. Thereafter, the data stored in the register is then sequentially read out through the I/O port to flash memory controller 31.

There are typically three operations in a NAND flash: read a page, program a page, and erase a block. That is, read and program operations take place on a page basis. The erase operation takes place on a block basis. In a page program operation, a page of data is written into data register 308 and then programed into the memory cell array. In a block erase operation, a group of consecutive pages is erased in a single operation.

As described above, at power-up, a conventional flash memory controller device does not have information about which block(s) of the memory cell array in the flash memory contains written data and which block(s) have been erased. In the case that a block contain written data, the controller still needs to know whether pages in the written block are available (i.e., they have been erased). Since a page cannot be written again as it had been written, the conventional flash memory controller must find out whether or not a page of the associated block has been erased. In order to determine that a block has been erased, the conventional flash memory controller has to read data of each page of the block. Since data in a selected page is read out sequentially through the I/O port, reading out of data in order for the conventional flash memory controller to determine whether a page has been erased is time intensive and consumes bandwidth between the external controller and the flash memory. Furthermore, data transmitting through the I/O port increases power consumption of the system.

According to some embodiments of the present invention, determining a selected page as being an erased page is performed by flash memory 33 itself. For example, flash memory 33 receives a command from flash memory controller 31 to write data to a selected page. After decoding the command, flash memory 33 will perform a read operation of the selected page. Reading the selected page includes sensing a voltage or current change of a number of bit lines corresponding to the selected page. Sensing the state of a selected cell may include applying a voltage to a selected word line, the bit line corresponding to the selected bit cell is sensed to determine whether or not a current flows through the selected bit cell. In an exemplary embodiment, the amount of current flowing through the selected bit cell determines the logic state of the bit cell.

In an embodiment of the present disclosure, the current change sensed in each bit line associated with a selected page is accumulated in a current accumulator. If the current level of the accumulated currents of all bit lines in a selected page is lower than a predetermined value, the selected page is determined to be an erased page. Conversely, if the current level of the accumulated (summed) currents of all bit lines in a selected page is higher than or equal to the predetermined value, the selected page is determined to be not an erased page, in other words, it is determined to be a programmed (written) page (i.e., a page containing written data).

In another embodiment of the present disclosure, the voltage change sensed in each bit line associated with a selected page is accumulated in a voltage accumulator. If the voltage level of the accumulated (summed) voltages of all bit lines in a selected page is higher than a predetermined value, the selected page is determined to be an erased page. Conversely, if the voltage level of the accumulated voltages of all bit lines in a selected page is lower than a predetermined value, the selected page is determined to be not an erased page or it is determined to be a programmed (written) page. In an embodiment, the total amount of current changes or voltage changes of a selected page is accumulated in accumulator 116 to a current level or a voltage level. In an embodiment, the accumulator is an absolute value accumulator, i.e., the current level or the voltage level has a positive value. Comparator 318 compares the accumulated current or voltage changes (total current or voltage amount of a selected page) with a predetermined current or voltage threshold value to determine whether the selected page is an erased page or a page containing written data.

Figure 5A:
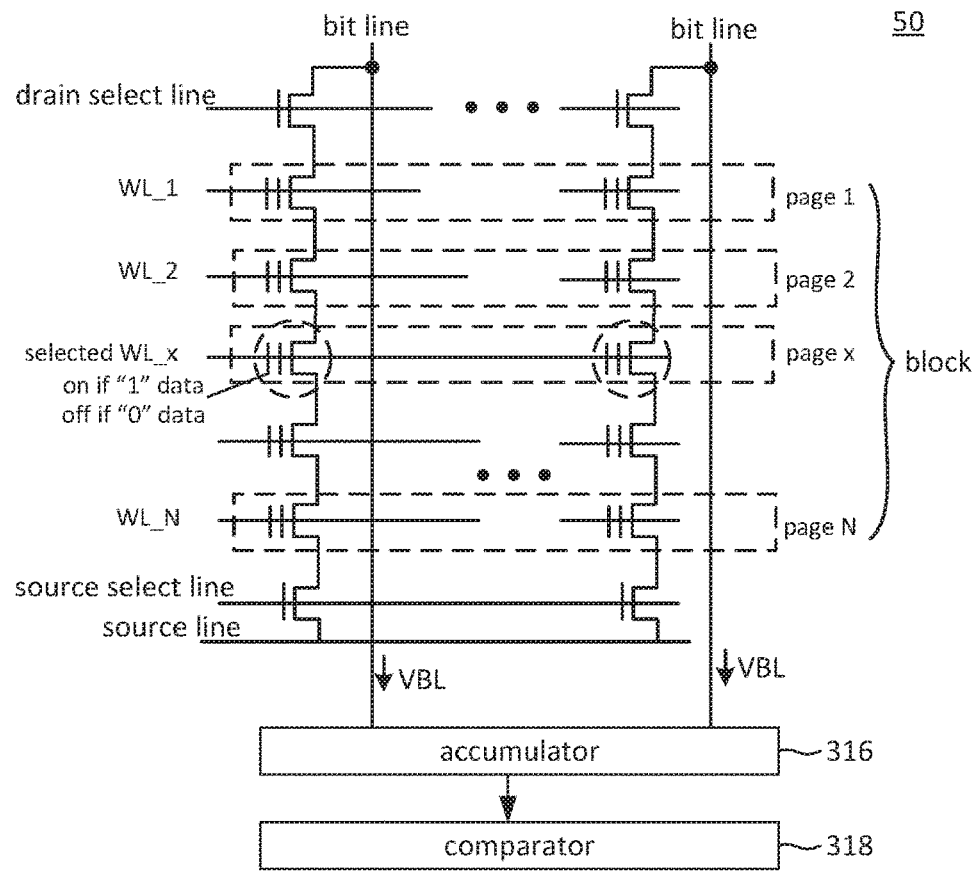
FIG. 5A is a schematic diagram illustrating a block of a flash memory architecture according to some embodiments of the present disclosure.

FIG. 5A is a schematic diagram illustrating a block 50 of a flash memory architecture according to embodiments of the present disclosure. Referring to FIG. 5A, block 50 includes a plurality of memory-cell strings, each string is connected between a bit line and a source line and includes a plurality of series-connected memory cells. Each memory cell has an n-channel MOSFET structure including a floating gate as a charge accumulation layer and a control gate. Adjacent memory cells share the drain or source. The control gates of memory cells of the same row are connected to a word line A group of memory cell strings which share word lines forms a block. In an erase operation, all memory cells in the block are erased. In the read and write operations, a first select transistor is turned on (by the drain select line) to connect a series-connected memory-cell string to a bit line. A selection voltage is applied to a word line, and a non-selection voltage is applied to the remaining word lines on the same memory cell string. The bit lines of a page sharing a selected word line are coupled to an accumulator 316. Accumulator 316 accumulates (sums) current or voltage changes on the bit lines and provides the summed current or voltage level (i.e., signal level) to comparator 318.

Each memory cell may store one or more bits of data. Memory cells that store one bit of data are referred to as single-level cells, and memory cells that store more bits of data are referred to as multi-level cells. Single-level cells are used in the following description to explain embodiments of the present disclosure. However, the present disclosure is not limited thereto. As appreciated by those of skill in the art, the teachings herein are also applicable to multi-level cells as well.

To perform a program operation, flash memory controller 31 transmits a program command via command connection 310, the data to be programmed and the physical address to the page to flash memory 33 via data connection 320. A row of the memory cell array corresponding to the requested page is selected. A memory cell is a MOS transistor having a floating gate for storing data in the form of electrical charge. For writing a logic "0" to a selected cell, bit line connected to the drain of the access transistor of the string is grounded, a voltage pulse is applied to the gate of the selected cell. For reading data from a selected cell, the bit line associated with the memory cell string is precharged to a certain voltage level, a voltage pulse is applied to the word line of the selected cell.

Referring still to FIG. 5A, block 50 includes a block having a number N of pages that are addressed by corresponding word lines WL_1, WL_2, . . . , WL_N. When a block is selected, the drain transistors are turned on (by the drain select line) to connect the memory cell strings to corresponding bit lines and the source transistors are turned on (by the source select line) to connect the memory cell strings to the source line. All pages of the block are selected, and the signals (currents or voltages) on the bit lines are accumulated in accumulator 316 to obtain a summed signal level. If the block is erased, the summed signal level has a first value. If the block has written data, the summed signal level has a second value different from the first value. By comparing the second value with the first value, it can be determined the state (erased state or written state) of the block. For example, in an embodiment, if the block is an erased block (all pages contain "1" data), all transistors in the cell strings are on, then the summed signal, e.g., the sum of all of the voltage changes has a value that is different from the sum of all of the voltage changes when the block is a written block (pages may contains "0" and "1" data). In another embodiment, the sum of all of the current changes of the selected block is accumulated to obtain a summed current value. When a selected block is an erased block, the sum of all of the currents of the bit lines is different than when the sum of all of the currents of the bit lines if the selected block is a written block.

Once a block is determined to be an erased block, an erased page in the block can be determined as follows. All unselected pages are "on" ("1"). Transistors of the selected page are "on" when they have "1" data and "off" when they have "0" data stored in their floating gate. For reading data from a selected memory cell, the bit line associated with the memory cell string of the selected memory cell is precharged, when the selected memory cell has "0" data, the transistor is turned off, so that there is no current flowing from the bit line to the source line. When the selected memory cell has "1" data, the transistor is turned on, so that a current flows from the bit line to the source line, thereby discharging the bit line.

Figure 5B:
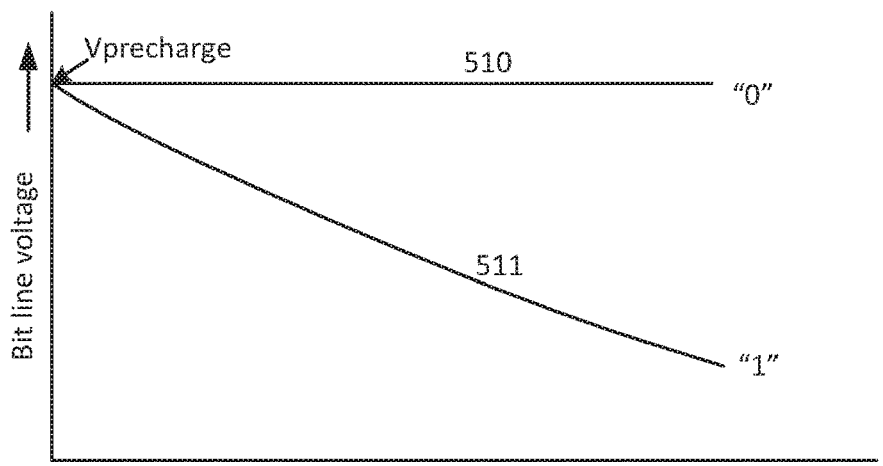
FIG. 5B illustrates a graph of a voltage on the bit line of a selected memory cell when data is "0" and "1" according to an embodiment of the present disclosure.

FIG. 5B illustrates a graph of a voltage on the bit line of a selected memory cell when data is "0" and "1" according to an embodiment of the present disclosure. When reading the selected page, the bit lines are precharged to a certain voltage level Vprecharge, as shown in FIG. 5B. When "0" data is stored in the selected memory cell, the transistor is "off", so that there is no current flow from the bit line to the source line, and there is no significant voltage change on the bit line (denoted by 310). When "1" data is stored in the selected memory cell, the transistor is "on", a path is formed from the bit line to the source line (e.g., ground potential), so that a current flows from the bit line to the source line causing a voltage change in the bit line (denoted by 311). In an embodiment of the present disclosure, the voltage change or the current change of all bit lines (e.g., the selected page) is summed in an accumulator. The amount of the summed voltages or currents is then compared with a threshold voltage or current value to determine whether or not the selected page is an erased page.

Figure 6A:
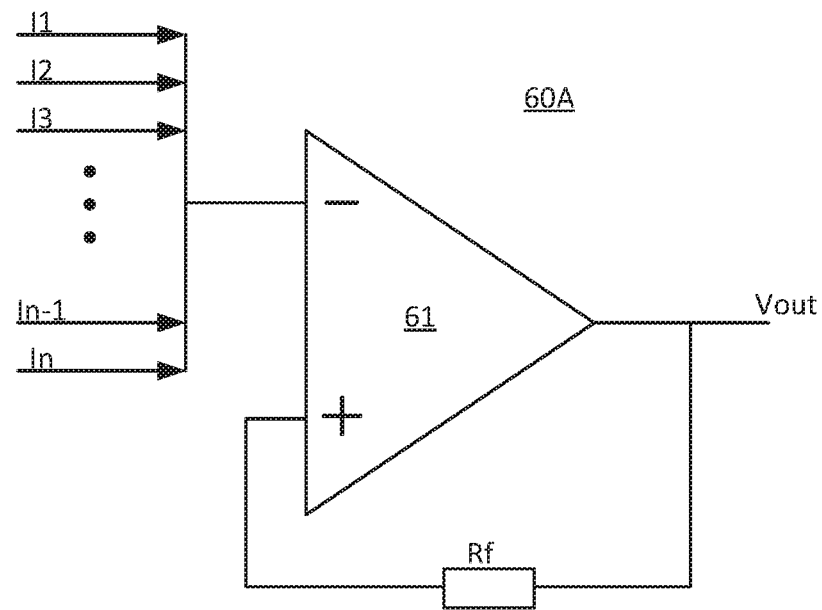
FIG. 6A is an exemplary current accumulator (a current summing circuit) according to an embodiment of the present disclosure.

FIG. 6A is an exemplary current accumulator (a current summing circuit) 60A according to an embodiment of the present invention. Current accumulator 60A includes an operational amplifier 61 having a negative input terminal, a positive terminal, and an output terminal coupled to the positive terminal through a feedback resistor Rf. Currents I1, I2, . . . , In−1, In of corresponding bit lines of a selected page are coupled to the negative input terminal of the operational amplifier. As is well known, the output Vout of current accumulator 60A with a feedback operational amplifier is obtained by applying Kirchhoff's first law to the input terminal of the operational amplifier according to the following relation:

$$V_{out} = -Rf(I1 + I2 + \ldots + In)$$

where I1, I2, ..., In are the current of corresponding bit lines of a selected page.

Figure 6B:
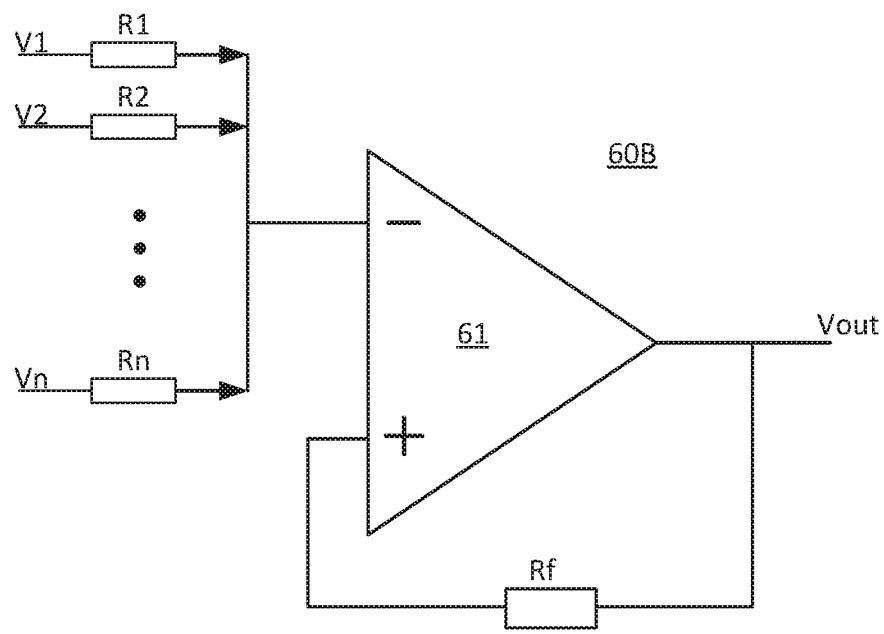
FIG. 6B is an exemplary voltage accumulator (a voltage summing circuit) according to an embodiment of the present disclosure.

FIG. 6B is an exemplary voltage accumulator (a voltage summing circuit) 60B according to an embodiment of the present invention. Voltage accumulator 60B is similar to current accumulator 60A in FIG. 6A with the difference that a resistor is connected between the voltage of the bit line and the input terminal of operational amplifier 61. Similar to the current accumulator, the output Vout of voltage accumulator 60B with a feedback operational amplifier is obtained by applying Kirchhoff's first law to the input terminal of the operational amplifier according to the following relation:

$$Vout=-Rf(V1/R1+V2/R2+ \ldots +Vn/Rn)$$

where V1, V2, ..., Vn are the voltage of corresponding bit lines of a selected page, R1, R2, ..., Rn are the corresponding resistors disposed between the bit line voltage and the input terminal of the operational amplifier. In an embodiment, R1, R2, ..., and Rn have the same value R, so that the output voltage of the voltage accumulator satisfies the following relation:

$$Vout=-Rf/R(V1+V2+ \ldots +Vn)$$

In an embodiment, the flash memory device determines whether or not a selected page is an erased page by comparing the output voltage of the accumulator to a predetermined threshold voltage. Since the output voltage of the accumulator has the maximum value (or the minimum value) when the selected page is an erased page. By comparing the output voltage Vout of the accumulator with a predetermined voltage value, the flash memory device may determine the state of the selected page.

In an embodiment of the present disclosure, the determination whether a selected page is an erased page is performed by a comparator.

Figure 7A:
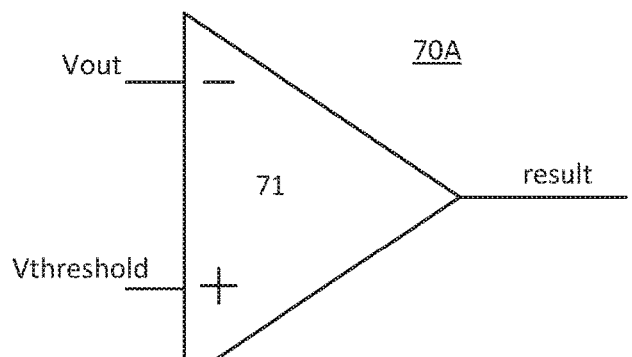
FIG. 7A illustrates an analog comparator circuit according to an embodiment of the present disclosure.

FIG. 7A is a simplified block diagram illustrating an analog comparator circuit 70A according to an embodiment of the present invention. Comparator circuit 70A includes an operational amplifier 71 having a positive input terminal, a negative input terminal and an output terminal. The output voltage Vout of the accumulator (60A, 60B) may be connected to one of the input terminal and the predetermined threshold voltage may be connected to another input terminal. The voltage state at the output terminal of comparator circuit 70A indicates the comparison result. In an embodiment, the comparison result is provided to control circuit 320 that is operative to save the current content of page counter 332 to last written page (LWP) register (322) upon determining that the page is an erased page based on the comparison result. The saved content of page counter 332 is the address data of the erased page in the block. Control circuit 320 is also operative to send the address data stored in LWP register 322 to flash memory controller 31 via I/O port 314. In some embodiments, upon determining that the page is an erase page, control circuit 320 may cause the current content of block counter 331 and the content of page counter 332 to be stored in LWP register 322 and output to flash memory controller 31 via I/O port 314.

Figure 7B:
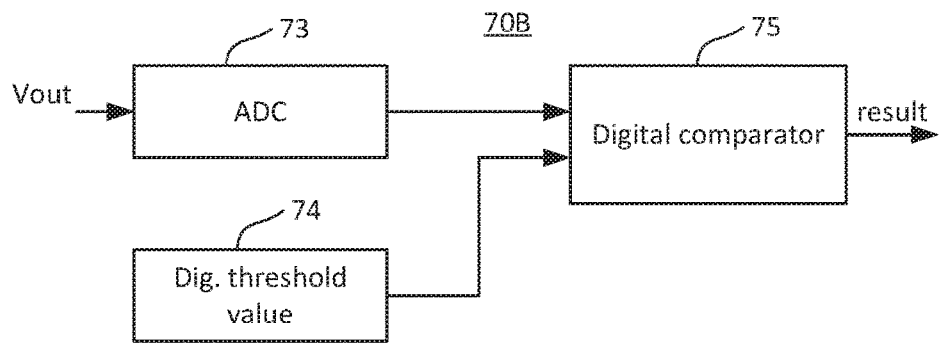
FIG. 7B illustrates a digital comparator circuit according to an embodiment of the present disclosure.

FIG. 7B is a schematic block diagram of a digital comparator 70B for comparing two voltages according to an embodiment of the present invention. Digital comparator 70B may include an analog-digital converter (ADC) 73, a register 74, and a digital comparator 75. ADC 73 converts the analog output signal Vout received from accumulator 316 to a digital representation having n bits. Register 74 contains a digital representation of the threshold voltage in n bits resolution. Digital comparator 75 compares these two digital values with each other based on software program executed by control circuit 320. The comparison result may be provided to control circuit 320 for further processing. One of skilled in the art will appreciate that the digital comparator can be implemented in hardware, software, or a combination of hardware and software. In some embodiment, functions of comparator 70B may be implemented by control circuit 320 that includes memory and one or more processing units and instruction codes stored in the memory and executable by the one or more processing units.

In some embodiments, the current or voltage signals on each bit of an erased page for multiple or all erased pages of the memory cell are sampled and accumulated (summed) by the accumulator to obtain a current or voltage sample value distribution of the memory device. In some other embodiments, all pages of each block of the memory array are erased, the current or voltage signals of each page are accumulated (summed) and presented as a distribution graph to determine the threshold current or voltage value.

Figure 8:
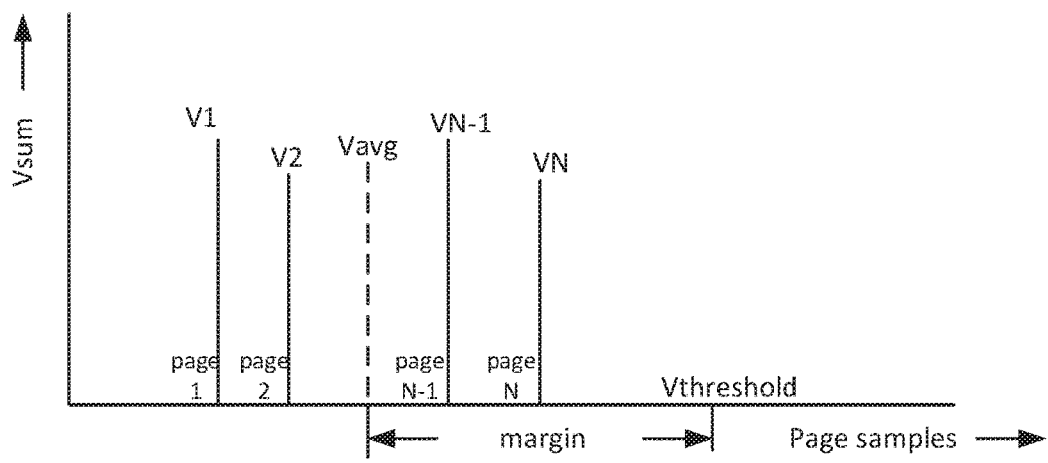
FIG. 8 is a graph of voltage distribution for a particular size of memory cell according to embodiments of the present disclosure.

FIG. 8 is a graph of voltage distribution for a particular size of memory cell array according to embodiments of the present invention. Referring to FIG. 8, the x-axis represents the page samples of a memory cell array, the y-axis represents the accumulated (summed) voltage Vsum of an erased page. The distribution of the voltage Vsum of each erased page is shown. In an embodiment, the threshold value can be selected from the average value of all summed voltage levels of all of the erased pages (page 1 through page N) with an additional margin to cover the process, voltage, and temperature (PVT) variations of the memory array device. The average value is the sum of the voltage level of each erased page divided by the number of erased pages; i.e., Vaverage=$\Sigma(V_1+V_2+V_3+ \ldots +V_N)$/N, where $V_1$, $V_2$, $V_3$, ..., $V_N$ are the summed voltages on the bit lines, and N is the number of erased pages in the measurement.

In some embodiments, flash memory 33 determines whether a page is an erased page by counting data read out to data register 308 using a "1's" or "0's" counter. Referring back to FIG. 3, a "1's" or "0's" counter is coupled to data register 308 and configured to count the total number of "0's" or "1's" in the data register.

In some embodiments, if the total number of counted "0's" or "1's" in the data register exceeds a threshold value, the page is considered to be an erase page or a written page. One of skilled in the art will appreciate that the counting and comparing operations can be implemented in hardware, software, or a combination of hardware and software by control circuit 320.

It will be appreciated by those of skill in the art that the above described techniques and circuits for determining an erased page in a block can also be applied to determine an erased block in a memory array. In conjunction with FIGS. 5A, 5B, 6A, 6B, 7A, 7B, and 8, a method for determining an erased block in a memory array will be explained. As described above, an erased block may be determined by selecting all blocks of the memory array device. For example, referring to FIG. 5A, a suitable voltage level is applied to the drain select line, to the source select line, the bit lines, and all the word lines, then the voltage signals on the bit lines are accumulated. If a block is erased, i.e., all transistors are turned on, so that a current path is formed between the bit line and the source line (across all of the pages in the block for each bit line) and discharges the bit line. In other words, the summed voltage at the accumulator 316 has a value different from a value where the some pages include written data, i.e., "0", so that no current paths are formed for some bit lines where the transistors contains "0" data. Thus, the status of a block can be determined by comparing the accumulated current or value of all bit lines of all of the selected pages with a threshold value. In an embodiment, the threshold value can be determined similarly using the method described above for determining an erased page. For example, voltage signals of each block are accumulated and represented in a graph having the x-axis the sampled block. The threshold value is then the distribution of accumulated values of the blocks in the memory array and an added margin, as shown in FIG. 8.

Figure 9:
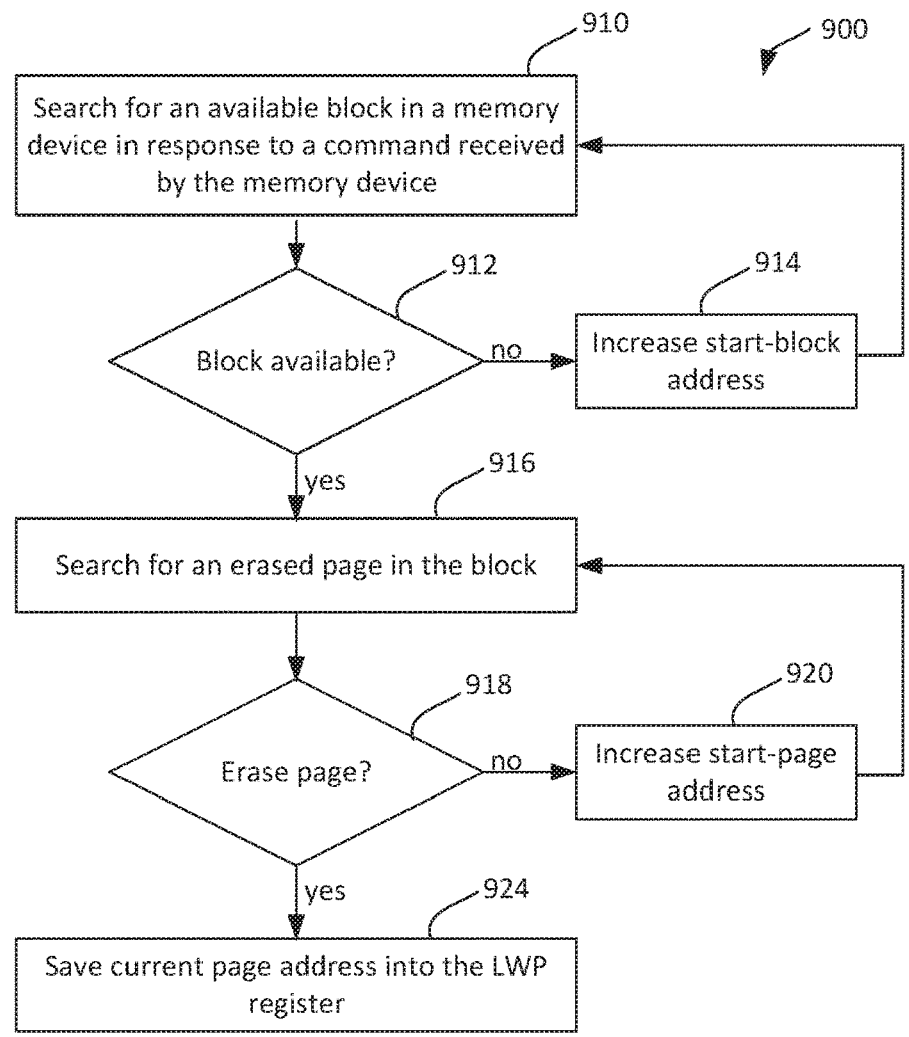
FIG. 9 is a flowchart illustrating a method of determining a status of a memory page in a flash memory device comprising a memory array including a plurality of block, where each block includes a plurality of pages, in accordance with an embodiment of the present disclosure.

FIG. 9 is a flow chart of method 900 of determining a status of a flash memory page in a flash memory comprising a memory array including a plurality of block, where each block includes a plurality of pages, in accordance with an embodiment of the present disclosure. Method 900 includes searching for an available block in response to a command received from a flash memory controller at 910. An available block is referred to as a block containing at least one erased page. For example, the flash memory controller attempts to locate an address of an available block into which the flash memory controller can write data, or, at power-up, the flash memory controller attempts to obtain information from the flash memory the address of the last written page of a written block. In an embodiment, the flash memory controller (e.g., 21 or 31) may issue a particular command to the memory device to obtain the address of the last written page. The control circuit (e.g., 320) in the flash memory (e.g., 33) may decode the particular command from the flash memory controller and instruct the flash memory to search for an available block. At 912, the control circuit may determine using the above-described accumulator and comparator to determine whether or not the block contains an erased page. For example, method 900 may start with a start-block address. If the block of the start-block address is not available (i.e., all pages contains written data) at 912, method 900 increases the start address (914) (e.g., using block counter 331) and goes back to step 910. Upon determining that the block contains at least one erased page, i.e., the block is available for new data, method 900 continues to step 916, which performs a search for an erased page in the block by sequentially addressing each page in the block. For example, method 900 may start with a start-page address and determines whether the addressed page is an erased page. If the addressed page is not an erased page, method 900 may increment the start-page address at 920 (e.g. using page counter 332) and repeats step 916. In the event that the addressed page is an erase page (yes in 918), method 900 saves the current page address in the Last Written Page (LWP) register and outputs the current page address to the controller through the I/O port.

In an embodiment, the flash memory device may include software or instruction sets stored in a memory and executable by the control circuit.

Figure 10:
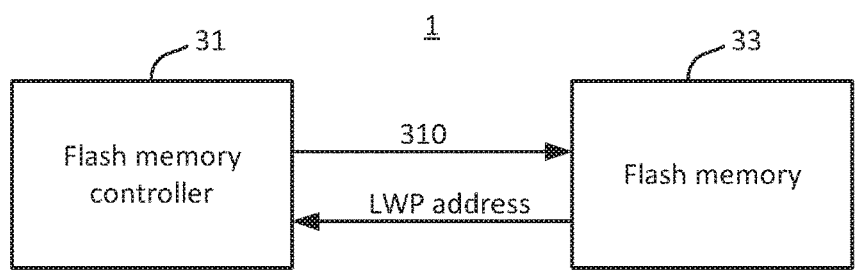
FIG. 10 is a block diagram of a flash memory system including a controller device and a NAND flash memory according to embodiments of the present disclosure.

FIG. 10 is a block diagram of a flash memory device 1 including a flash memory controller device 31 and a flash memory 33 according to embodiments of the present disclosure. In an embodiment, flash memory 33 includes a NAND flash. Controller 31 sends a special read command inquiring a last written page address to flash memory 33. After decoding the received read command, the control circuit (e.g., control circuit 320) of the flash memory is aware that the controller is requesting the last written page of the flash memory and executes the steps described in method 900 to search for the last written page. Once the last written page is found, the flash memory sends the associated address of the last written page to the flash memory controller. The present disclosure provides many advantages over conventional techniques. For example, comparing with the conventional techniques that require transmitting whole page data to the flash memory controller for searching the last written page, the data transfer is reduced to the flash memory transmitting the last written page address to the flash memory controller according to the present disclosure. Accordingly, the channel bandwidth and transmission power between the flash memory controller and the flash memory are significantly reduced, thereby improving the system performance.

While the present disclosure is described herein with reference to illustrative embodiments, this description is not intended to be construed in a limiting sense. Rather, the purpose of the illustrative embodiments is to make the spirit of the present disclosure be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present disclosure could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A flash memory device comprising:
   a flash memory comprising a plurality of blocks, each block comprising a plurality of pages;
   a control circuit configured to:
      receive a command;
      decode the received command to determine whether the command is a last written page command;
      upon determining that the command is the last written page command, select a block of the plurality of blocks, perform a number of iterations, each of the iterations comprising:
      obtain a measurement of a signal level of a page in the selected block;
      compare the signal level with a first predetermined threshold value;
      determine whether the page is an erased page based on a first comparison result;
      upon determining that the page is an erased page, save an address associated with the erased page and output the address of the erased page; and
      upon determining that the page is not an erase page, perform a next iteration.

2. The flash memory device of claim 1, wherein the selected block is a block having at least an erased page.

3. The flash memory device of claim 2, wherein the control circuit is configured to:
   obtain a signal level of the selected block;
   compare the signal level of the selected block with a second predetermined threshold value;
   determine whether the selected block contains at least an erased page based on a second comparison result;

upon determining that the selected block does not contain at least an erased page, select a next block in the plurality of block and repeat until a block is found to contain at least an erased page.

4. The flash memory device of claim 3, wherein the signal level of the selected block is a measurement of voltage or current changes on a plurality of bit lines associated with the selected block.

5. The flash memory device of claim 3, wherein the second predetermined threshold value is an average voltage value of a sum of voltages of blocks having at least an erased page.

6. The flash memory device of claim 1, further comprising:
a last written page register configured to store the address associated with the erased page; and
an interface circuit coupled to the last written page register and configured to communicate the stored address to a controller.

7. The flash memory device of claim 1, further comprising a page address counter configured to generate a page address to select a next page until an erased page in the selected block is found.

8. The flash memory device of claim 1, further comprising:
an accumulator configured to obtain the measurement of the signal level of the page in the selected block by summing signals on bit lines associated with the page; and
a comparator configured to compare the signal level with the first predetermined threshold value threshold voltage.

9. The flash memory device of claim 8, wherein the accumulator is an analog summing circuit including a first operation amplifier and the comparator is an analog comparator including a second operation amplifier.

10. The flash memory device of claim 8, wherein the accumulator is an analog summing circuit including an operation amplifier and the comparator comprising an analog-to-digital converter.

11. The flash memory device of claim 1, wherein the flash memory comprises a NAND flash.

12. A method of determining a last written page of a flash memory device having a plurality of blocks, the method comprising:
receiving a command;
decoding the received command to determine whether the command is a command requesting a last written page address;
selecting a block of the plurality of blocks upon determining that the command is the last written page command;
performing a number of iterations, each iteration comprising:
obtaining a measurement of a first signal level associated with a page of the block;
comparing the first signal level with a first predetermined threshold value to obtain a first comparison result;
determining a state of the page of the block based on the first comparison result; and
performing a next iteration until a page of the block is found to be an erased page;
storing an address of the erased page in a register; and
outputting the address to an external device.

13. The method of claim 12, wherein selecting the block of the plurality of blocks comprises:
obtaining a measurement of a second signal level associated with the block;
comparing the second signal level with a second predetermined threshold value to obtain a second comparison result;
determining whether the block contains at least an erased page based on the second comparison result;
upon determining that the block does not contains at least an erased page, selecting a next block of the plurality of blocks;
repeating the obtaining, comparing, and determining steps until a subsequent block of the plurality of blocks is found to contain at least an erased page.

14. The method of claim 13, wherein the second signal level is associated with voltage or current changes on a plurality of bit lines associated with the selected block.

15. The method of claim 13, wherein the second predetermined threshold value is an average voltage value of a sum of voltages of blocks having at least an erased page.

16. The method of claim 12, wherein obtaining the measurement of the first signal level comprising accumulating signal changes on a plurality of bit lines associated with the page of the block.

17. The method of claim 12, wherein the first predetermined threshold value is an absolute maximum value of a page having all of bits written to "0's" or "1's".

18. A flash memory device comprising:
a flash memory comprising a plurality of blocks, each block comprising a plurality of pages, each page comprising a plurality of bit lines;
a decoder configured to determine whether a received command is a last written page command;
an accumulator coupled to the plurality of bit lines and configured to accumulate signal changes on the plurality of bit lines to obtain a signal level;
a comparator configured to compare the signal level with a predetermined threshold value to obtain a comparison result;
a control circuit configured to control whether the accumulator and the comparator are operative based on a decode result of the decoder.

19. The flash memory device of claim 18, further comprising:
a block counter configured to select a block of the plurality of blocks;
a page counter configured to select a page of the selected block;
a register configured to store an address associated with an erased page,
wherein the control circuit is operative to determine an address of the selected block based on a content of the block counter and an address of the selected page based on a content of the page counter and save the determined address of the selected block and the determined address of the selected page into the register.

20. The flash memory device of claim 18, wherein the accumulator is an analog summing circuit including a first operation amplifier, and the comparator is an analog comparator including a second operation amplifier.

21. The flash memory device of claim 18, wherein the predetermined threshold value is a digital value, the accumulator is an analog summing circuit including a first operation amplifier for outputting the signal level, and the comparator comprises an analog-to-digital converter configured to convert the signal level to a digital representation and compare the digital representation with the digital value.

22. The flash memory device of claim 18, wherein the predetermined threshold value is a digital value, the accumulator is a digital counter coupled to a data register and configured to count a total number of "0's" or "1's" stored in the data register, and the comparator is a digital circuit configured to compare the total number of "0's" or "1's" with the digital value.

\* \* \* \* \*